United States Patent [19]
Anagnostopoulos et al.

[11] Patent Number: 6,001,668
[45] Date of Patent: Dec. 14, 1999

[54] METHOD OF FABRICATING A IMAGE SENSOR HAVING ITO ELECTRODES WITH OVERLAPPING COLOR FILTERS FOR INCREASED SENSITIVITY

[75] Inventors: Constantine N. Anagnostopoulos, Mendon; Stephen Lawrence Kosman, Rochester; Win-chyi Chang, Penfield, all of N.Y.

[73] Assignee: Eastman Kodak Company, Rochester, N.Y.

[21] Appl. No.: 08/997,495

[22] Filed: Dec. 23, 1997

Related U.S. Application Data

[62] Division of application No. 08/731,036, Oct. 8, 1996, Pat. No. 5,798,522.

[51] Int. Cl.$^6$ .................................................. H01L 21/70
[52] U.S. Cl. ................................. 438/70; 438/69; 438/73; 257/231
[58] Field of Search .................................. 438/57, 69, 70, 438/73; 257/231, 232

[56] References Cited

U.S. PATENT DOCUMENTS 5,677,202  10/1997  Hawkins et al. .
5,719,074  2/1998  Hawkins et al. .

*Primary Examiner*—Charles Bowers
*Assistant Examiner*—Keith Christianson
*Attorney, Agent, or Firm*—James D. Leimbach

[57] ABSTRACT

By incorporating an ITO electrode which is more transparent than polysilicon, and designing the pixel such that it has asymmetric gates with as much as possible of its light sensitive region covered by an ITO electrode, light sensitivity is increased. To solve the problem of impurity diffusion from the ITO electrode into the silicon below, the conventional Silicon Dioxide gate dielectric was replaced with an Oxide/Nitride/Oxide stack. Employing at least some polysilicon electrodes with ITO electrodes is desirable to allow entrance passages through which hydrogen passivation can be accomplished. The pixel architecture can be designed to increase sensitivity further by other design choices. The first of these choices is to incorporate a lenslet on each pixel such that as much as possible of the light falling on the pixel is made to pass through the portion of the pixel covered with ITO. The pixel light sensitivity improves not only because the light passes through the more transparent ITO electrode, but also because some of the light that would have fallen on the LOD region and would be lost, is now collected. The second method is for color CCD sensors with color filter patterns, such as the "BAYER" color filter pattern to name just one, to have the overlap of the color filters, which does not allow light transmission, to occur over the less sensitive area of the pixel, which is the area covered with the polysilicon electrode. For proper operation a slight modification of the vertical clock timing is needed.

7 Claims, 4 Drawing Sheets

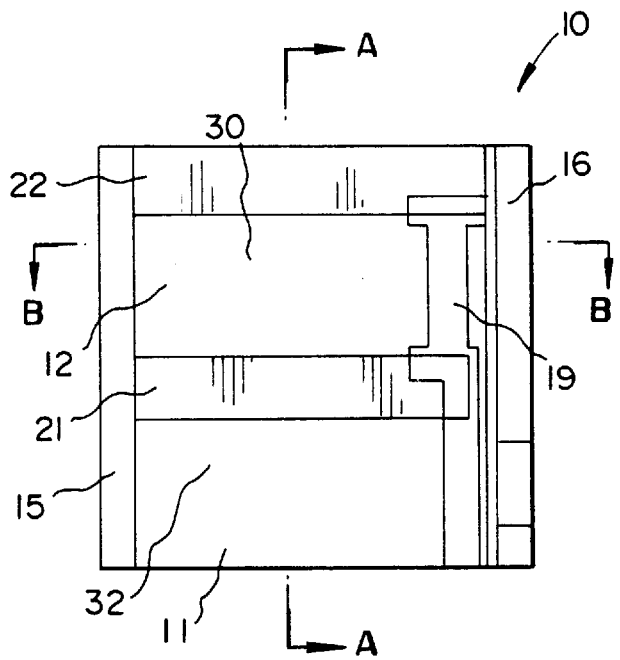
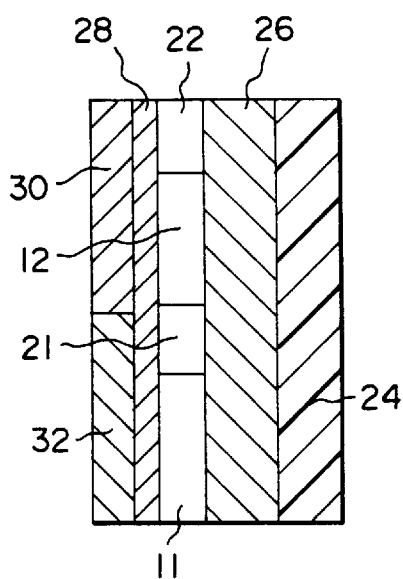
FIG. 1  FIG. 2A
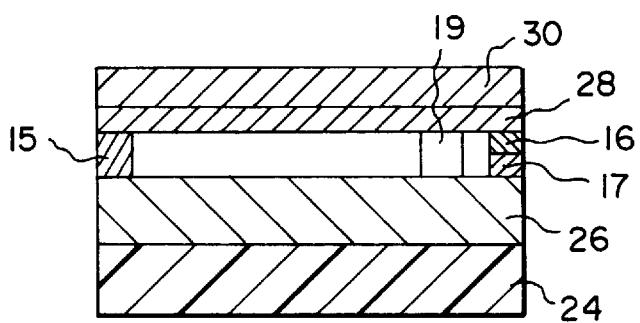
FIG. 2B

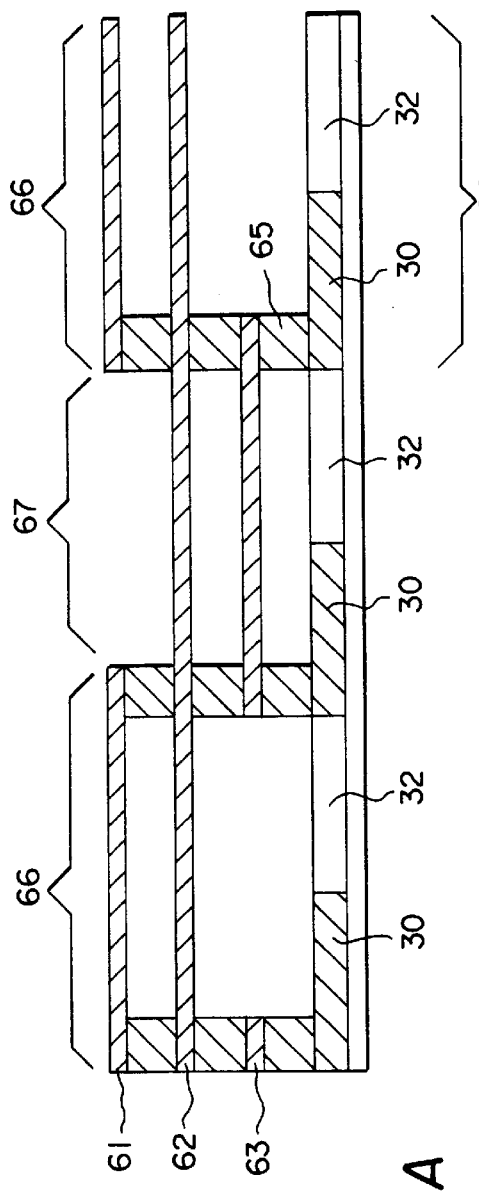
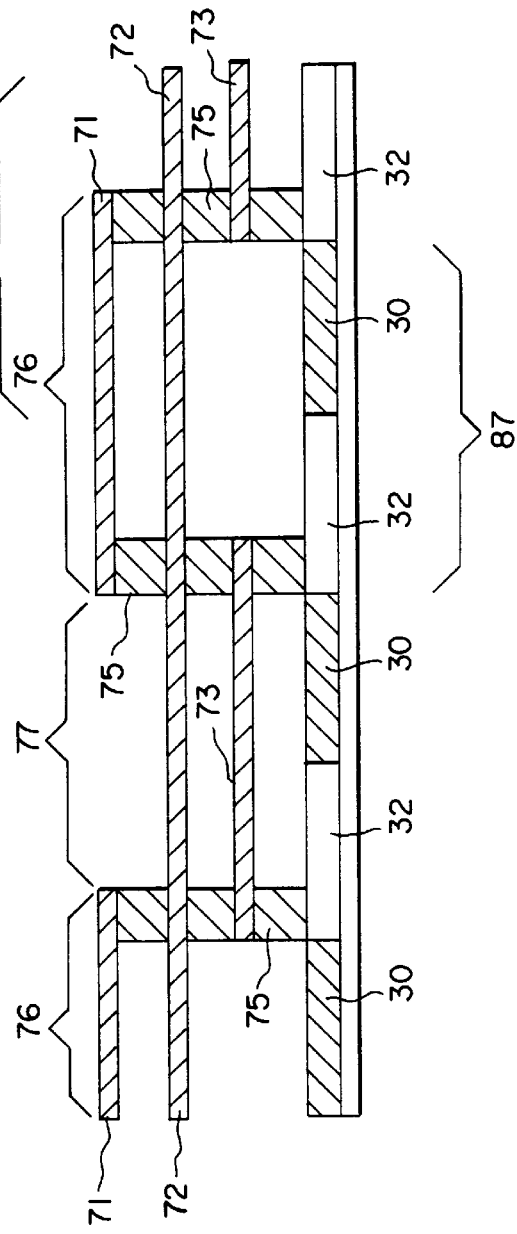
FIG. 4A PRIOR ART
FIG. 4B

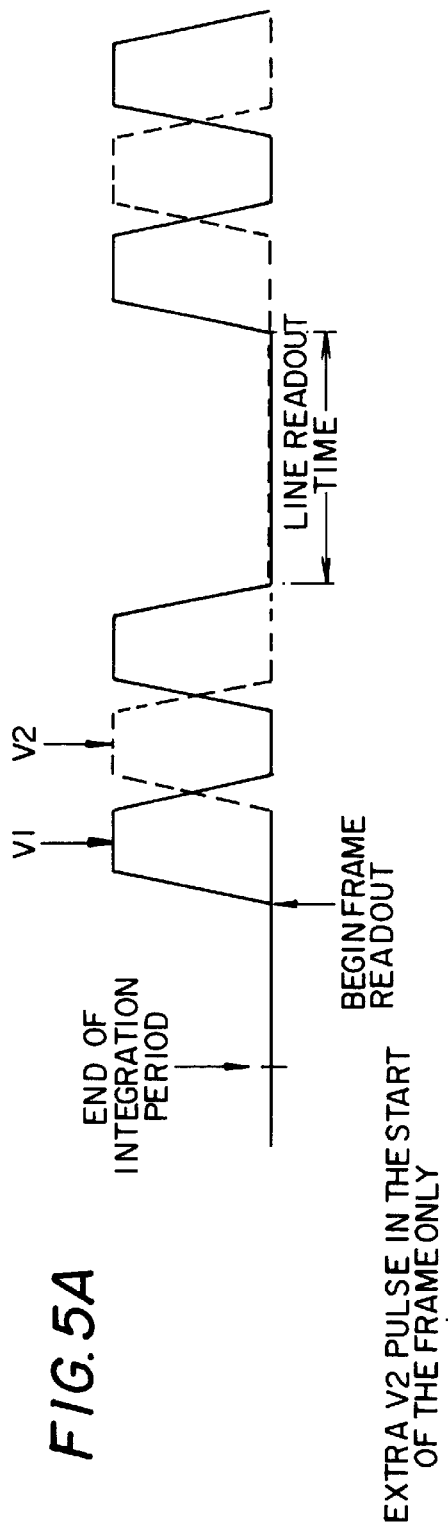
FIG. 5A
FIG. 5B
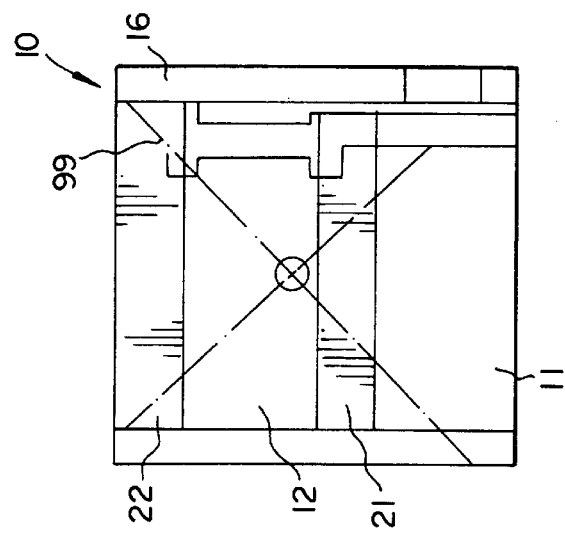
FIG. 6

METHOD OF FABRICATING A IMAGE SENSOR HAVING ITO ELECTRODES WITH OVERLAPPING COLOR FILTERS FOR INCREASED SENSITIVITY

CROSS-REFERENCE TO RELATED APPLICATIONS

The present application is a division of application Ser. No. 08/731,036 filed on Oct. 8, 1996 now U.S. Pat. No. 5,798,522, based on Docket 73693, filed at the same time as the present invention, by Constantine Anagnostopoulos, et al., and entitled, "Image Sensor Having ITO Electrodes With An ONO Layer."

FIELD OF INVENTION

The invention relates generally to the field of image sensors, and more particularly to electrode structures used in MOS devices.

BACKGROUND OF THE INVENTION

In order to reduce the cost, power consumption, weight, and volume of digital cameras, it is necessary to make the CCD image sensor as small as possible while maintaining the required resolution. This is typically accomplished by decreasing the pixel size. However, for optics having the same focal number, the smaller pixel receives less total light and consequently the sensor is less sensitive. One method of increasing light sensitivity is to incorporate an Indium Tin Oxide (ITO) electrode which is more transparent than polysilicon, and to design the pixel with asymmetric gates so that as much as possible of its light sensitive region is covered with ITO.

However, in full frame CCD image sensors, ITO electrodes employed to replace the second level polysilicon electrode can result in significant amounts of impurities leaching out of the ITO electrode and into the Silicon below, significantly altering the surface channel potentials. Both p- and n-type impurities are found to diffuse through the gate dielectric and into the silicon surface. The surface impurities form interface states that are populated during normal device operation, causing a further shift in the channel potentials. While the leaching out of these impurities does not result in catastrophic conditions for the device, it does present a situation in which the operating point of the devices shift with time. Also, the large density of surface states, caused by the impurities at the Silicon/Silicon Dioxide interface, cause signal loss to occur due to a phenomenon called "charge pumping."

A PhD. Thesis by Christianus Hermanus Leopold Weijtens at the Technical University of Eindhoven, entitled, "Indium Tin Oxide for Solid-State Image Sensors," attempted to use a silicon nitride ($Si_3N_4$) layer within image sensors to prevent the leaching of material from ITO electrodes into the silicon below. There was a shortcoming in these attempts because: (1) the ITO electrode would not properly adhere to the $Si_3N_4$ layer; and (2) the lack of hydrogen passivation of the silicon surface at the interface with the silicon dioxide gate dielectric.

Another issue which can effect pixel sensitivity within image sensors is that of light falling in regions of the pixel that are not light sensitive, such as the drain required for the formulation of the antiblooming LOD structure. This loss of sensitivity cannot be recovered by the mere substitution of a polysilicon electrode with an ITO electrode.

Still other problems exist in image sensing devices employing color filter patterns. These color filters are arranged in patterns in which the color filters overlap. In patterns such as the "BAYER" color filter pattern, to name just one, the non-overlapping areas do not allow light transmission. Typically these areas between the color filters are over a sensitive area of the pixel, leading to a sensitivity loss.

As can be seen by the foregoing discussion, there remains a need in the art for pixel architectures that result in pixel designs that improve the sensitivity of image sensing devices.

SUMMARY OF THE INVENTION

The present invention is directed to overcoming one or more of the problems set forth above. By incorporating an ITO electrode which is more transparent than polysilicon, and designing the pixel such that it has asymmetric gates with as much as possible of its light sensitive region covered by an ITO electrode, light sensitivity is increased. To solve the problem of impurity diffusion from the ITO electrode into the silicon below, the conventional Silicon Dioxide gate dielectric was replaced with an Oxide/Nitride/Oxide stack of 250/250/100A or alternatively 300/300/75A. Electrical measurements and Neutron Activation Analysis have shown that neither n- nor p-type impurities are leaching from the ITO electrodes to the Silicon below. Removing the nitride from small areas in the pixel, typically located beneath the polysilicon electrode and in the drain region of the LOD structure, allows for passivation of the $SiO_2$ interface of the entire pixel.

The pixel architecture can be designed to increase sensitivity further by other design choices. The first of these choices is to incorporate a lenslet on each pixel such that as much as possible of the light falling on the pixel is made to pass through the portion of the pixel covered with ITO. The pixel light sensitivity improves not only because the light passes through the more transparent ITO electrode, but also because some of the light that would have fallen on the LOD region and would be lost, is now collected.

The second method is for color CCD sensors with color filter patterns, such as the "BAYER" color filter pattern to name just one. In such devices the overlap of the color filters, which does not allow light transmission, is made to occur over the less sensitive area of the pixel that is covered with the poly electrode. For proper operation a slight modification of the vertical clock timing is needed.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention provides the advantages of making a smaller, less costly sensor and camera without loss of performance. In addition, both small and large pixels, true two-phase Full Frame sensors, can benefit from replacing the second electrode with ITO. By designing the ITO phase to be larger than the poly phase, by shifting the color filters so they overlap in a poly region, and by using lenslets to focus as much as possible of the light through the ITO electrode and by focusing it away from the LOD region where it would be wasted. Incorporation of the ONO gate dielectric in full frame CCD imagers, or other MOS services, with Indium Tin Oxide (ITO) electrodes produces predictable channel potentials that will not drift due to impurity diffusion resulting in stable device manufacturing yields.

BRIEF DESCRIPTION OF THE DRAWINGS

FIG. 1 is a diagram of the pixel architecture as envisioned by the present invention;

FIG. 2A is a cross section of FIG. 1 taken through the storage areas of the pixel of FIG. 1 as indicated by the line A—A;

FIG. 2B is a cross section of FIG. 1 taken through one of the phases of the pixel along the line B—B;

FIG. 4A is a diagram of a prior art pixel architecture illustrating color filter array without shifting;

FIG. 4B is a diagram of the pixel architecture of the present invention illustrating the color filter array shift;

FIG. 5A is a timing diagram for a typical prior art pixel as shown in FIG. 3A;

FIG. 5B is a timing diagram for the pixel of the present invention as shown FIG. 3B; and FIG. 6 shows the pixel of FIG. 1 with the outline of the lenslets drawn on it and the area on the pixel where the lenslet focuses the falling on the pixel.

To facilitate understanding, identical reference numerals have been used, where possible, to designate identical elements that are common to the figures.

DETAILED DESCRIPTION OF THE INVENTION

Figure 3A:
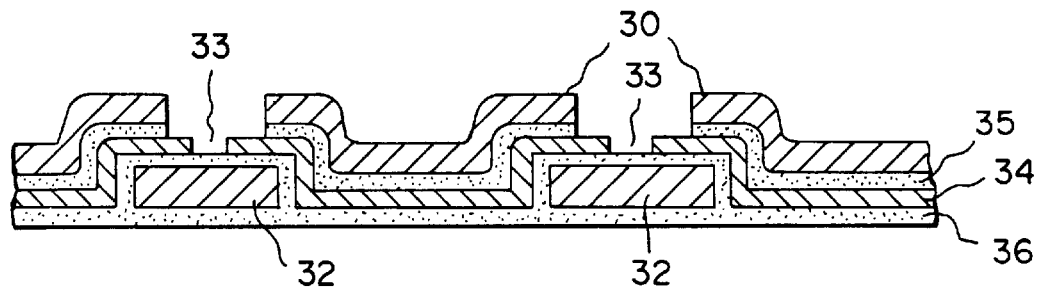
FIG. 3A is a cross section of a pixel of the present invention having passivation provisions.

It has been discovered that increased sensitivity within frame transfer image sensors can be obtained by employing an improved pixel design.

An ONO gate dielectric is incorporated in the full-frame sensors primarily because of the property of the Nitride to block any impurities, such as Indium, from leaching out of the ITO electrode and modifying the channel potentials near the Silicon surface. Nitride, however, because of its higher index of refraction, compared to $SiO_2$, improves the light transmittance both through the polysilicon and ITO gates.

Referring to FIG. 1, an improved pixel design is shown as envisioned by the present invention. Pixel 10 as envisioned by the present invention has first and second storage areas 11, 12 each having a respective barrier region 21, 22 to prevent stored charge from spilling out of the storage areas 11, 12. A lateral overflow drain 16 is provided for anti-blooming protection.

Referring now to FIG. 2A, which is a cross sectional view of FIG. 1 along line AA taken through the storage areas 11, 12 and the barrier regions 21, 22, illustrates the construction of pixel 10 having substrate 24, that is preferably a highly doped p-type substrate, with an epitaxial layer 26 that is of a lesser doped p-type material formed thereon that extends to the surface. The storage regions 11, 12 are preferably formed from a lightly doped n-type implantation into the epitaxial layer 26. The additional structures used to construct the pixel 10 are also formed in epitaxial layer 26 such as barriers 21, 22 which are formed using the same n-type implant as in the storage region and an additional light p-type implant.

Referring to FIG. 2B, the barrier region 19, which constitutes the overflow barrier to the drain to prevent blooming, is constructed exactly the same as barrier regions 21 and 22, but is drawn narrower to take advantage of the "short channel effect" and thus produces a slightly deeper surface channel potential. A channel stop 15 is formed preferably from a p+ implant. The lateral overflow drain 16 is formed using a high dose n-type implant within a p-type container implant 17. These structures formed upon epitaxial layer 26 have a potential that is controlled through an indium tin oxide electrode 30 and polysilicon electrodes 32 which are separated from these structures by ONO dielectric 28.

Incorporation of the ONO gate dielectric in full frame CCD imagers, or other MOS services, with Indium Tin Oxide (ITO) electrodes, produces predictable channel potentials that will not drift due to impurity diffusion from the gate dielectric, resulting in stable device manufacturing yields.

Studies have shown that replacing the second level polysilicon electrode with an ITO electrode in full frame CCD image sensors results in significant amounts of impurities leaching out of the ITO electrode and into the Silicon below. This leaching of impurities significantly alters the surface channel potentials of the device. The data indicates that both p- and n-type impurities appear to be diffusing into the surface of the silicon from the ITO electrode. These surface impurities form interface states that are populated during normal device operation causing a further shift in the channel potentials. While the impurities leaching out do not seem to result in catastrophic conditions for the device, they do cause the operating point of the devices to shift with time.

It has also been observed within prior art devices containing polysilicon electrodes, that the large density of surface states, caused by the impurities at the Silicon/Silicon Dioxide interface, cause signal loss to occur due to a phenomenon called "charge pumping." It is then required that the potential of the second barrier 22 differ from standardized norms, with tighter specifications. To solve the problem of impurity diffusion from the ITO electrode into the silicon below, the conventional Silicon Dioxide gate dielectric is replaced with an Oxide/Nitride/Oxide stack of 250/250/100A or alternatively 300/300/50A. Electrical measurements and Neutron Activation Analysis have shown that neither n- nor p-type impurities are leaching from the ITO electrodes to the Silicon below.

Figure 3B:
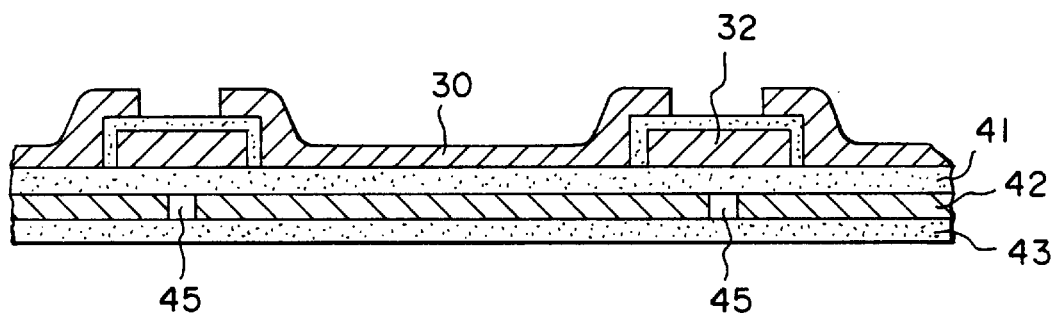
FIG. 3B is a cross section of a pixel of the present invention having surface passivation provisions.
Figure 3C:
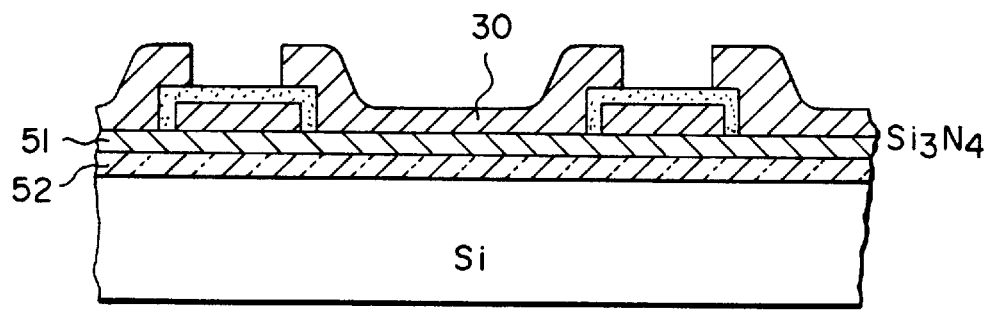
FIG. 3C is a cross section of a pixel of the present invention having surface passivation provisions.

Referring to FIGS. 3A–3C, in order to passivate the silicon below the electrodes, hydrogen is typically placed along the interface between the gate dielectric and the silicon surface by a diffusion process. To facilitate this process, the preferred embodiment of the present invention envisions a multiphase device having at least one of the phases employing an ITO electrode and at least one of the phases employing a polysilicon electrode. To allow for hydrogen passivation of the surface, the removal in the nitride layer is required from a small area at each pixel site. Since the reason for using an ONO stack is to prevent ITO from leaching into the silicon surface, the preferred embodiment of the present invention employs polysilicon as one of the electrodes. A small portion of the nitride layer either above or below the polysilicon electrode is removed to allow the hydrogen to flow through and passivate the silicon. In this manner the impurities from the ITO are blocked by the polysilicon where the nitride has been removed.

FIG. 3A shows alternating ITO electrodes 30 and polysilicon electrodes 32. The ONO stack is formed by nitride layer 34, top oxide layer 35, and bottom oxide layer 36. The nitride layer 34 runs across the top of the polysilicon electrodes 32. A small rectangular cut 33 is made in the nitride layer on top of the polysilicon electrodes 32 to allow hydrogen to enter and passivate the surface of the silicon. Placement of the cut 33 in the nitride layer 34 prevents the impurities from the ITO from leaching into the silicon, because the polysilicon electrode 32 itself is a barrier to the diffusion of these impurities.

FIG. 3B shows another embodiment whereby a path for hydrogen is provided to the silicon surface to allow for the passivation of the dangling bonds out the surface of the silicon. Here, ITO electrodes 30 and polysilicon electrodes 32 are formed upon an ONO stack comprising three layers that completely run beneath the electrodes. These layers are top oxide layer 41, nitride layer 42, and bottom oxide layer 43. To allow hydrogen to flow onto the silicon surface, the nitride layer 42 has a rectangular cut 45 beneath the polysilicon electrodes 32. The hydrogen passes through openings 45 and into the silicon below. While the polysilicon electrode 32 serves to block any impurities from the ITO electrode from diffusion into the silicon below.

FIG. 3C illustrates a prior art device having ITO electrodes 30 and nitride layer 51. The nitride layer 51, upon silicon dioxide layer 52, prevents the leaching of the ITO into the silicon surface. However, there is no provision for the ONO layer as taught by the present invention. The ONO layer as taught by the present invention enables the electrodes to adhere to the surface of the device. Moreover, there is no provision within the nitride layer 51 to allow for the hydrogen to passivate the surface of the silicon.

Referring to FIG. 6, it has been discovered that pixel sensitivity can be increased further by incorporating a lenslet 99 on each pixel 10 such that as much of the incident light as possible falling upon the pixel 10 is made to pass through the portion of the pixel 10 covered with ITO. The pixel light sensitivity improves not only because the light passes through the more transparent ITO electrode, but also because some of the light that would have fallen on the drain 16 of lateral overflow structure and be lost, is now collected.

In constructing the pixel area for color CCD sensors having color filter patterns, such as the "BAYER" color filter pattern to name just one, forming the color filter patterns such that the sensitivity of the pixel 10 is increased can be achieved by strategically overlapping edges of the filters. Referring to FIG. 4A, a typical prior art device is illustrated having its color filters (magenta 61, yellow 62, and cyan 63) arranged to create red pixels 66, and green pixels 67 in patterns such that the overlapping regions 65 exist above portions of the pixel 10 that are sensitive to light. These overlapping regions form dark areas which do not allow the transmission of light onto the pixel area. It has been discovered that by situating these overlapping color filter areas such that they occur over the less sensitive area of pixel 10, greater economy of the light sensitive areas of pixel 10 can be achieved. In FIG. 4A the overlapping regions 65 are above the ITO electrodes 30 which are more transparent than the polysilicon electrodes 32, and therefore, the pixel area below the ITO electrodes 30 is a more sensitive area than the area below the polysilicon electrodes 32.

FIG. 4B illustrates the color filter concept of the present invention, having its color filters (magenta 71, yellow 72, and cyan 73) arranged to create red pixels 76 and green pixels 77 in patterns such that the overlapping regions 75 of the color filters yield dark areas over the polysilicon electrodes 32. This allows more of the light falling on the pixel 10 to pass through the ITO electrode 30 which is more transparent than the polysilicon electrode 32.

FIG. 4A illustrates a conventional frame transfer, two-phase device having electrodes made from ITO and polysilicon. More commonly, both phases have been made in the past from polysilicon electrodes in conventional devices (not shown). These more common prior art devices have employed an architecture that has evolved to a sophisticated point such that it may not be desirable to change all aspects of this chip architecture in order to employ the features of the present invention. This prior art chip architecture therefore, has designed the circuits that remove charge from the sensor chip. In order to retain these circuits within the architecture and still employ the aspects of the present invention, the preferred embodiment of the present invention employs a novel technique.

This technique can be visualized by referring back to FIG. 4B which illustrates the present invention having at least one of the ITO electrode 30 and one polysilicon electrode 32 in each pixel made. The present invention as seen in FIG. 4B provides color filters that have overlapping regions 75 over the polysilicon electrodes 32. The preferred embodiment of the present invention seeks to incorporate the pixel architecture of the present invention with output structures that have been previously employed in chip architectures. In this manner only the pixel design is changed while the remaining circuit portions, from previous sensor architectures, remains the same.

To facilitate this desire, the pixel shown in FIG. 4B has effectively been divided into an electrical pixel 86 and an optical pixel 87. The electrical pixel 86 (that part which includes the clocking mechanism to remove accumulated photo generated electrons) comprises the same arrangement used as the pixel 85 in FIG. 4A. The optical pixel 87 comprises those elements used to generate the same color after the shifting of the color filters and has been retained with the improved pixel architecture as shown in FIG. 4B within an environment in which there is an optical pixel that differs in configuration from the electrical pixel 86 due to the offsetting of the overlapping portions of the color filter arrays in FIG. 4B. Thus, green pixel 77 within the present invention is offset from the prior art green pixel 67 by a single clock phase. In order to retain the chip architecture of the prior art device as shown in FIG. 4A, this single clock phase must be compensated for.

Referring to FIG. 5A and FIG. 5B, which respectively illustrate the vertical clock timing used for the device shown in FIG. 4A and FIG. 4B respectively, the timing diagram for the vertical clocking used to compensate for the single phase difference between the optical pixel and the electrical pixel discussed above is clearly illustrated. At the end of the integration period, as shown in FIG. 5B, there is an extra V2 clock pulse to begin frame readout. This extra V2 clock pulse is not used by the prior art device, and provides for the placing of all charge within red pixel 76 as shown in FIG. 4B within the optical pixel area 87 within the electrical pixel 86 area by application of this single clock pulse. In this manner all the optical pixels 87 are placed into the electrical pixel 86 areas and then clocked out identically as was done in the prior art.

It should be understood by those skilled in the art that the pixel architecture of the present invention can be employed within a sensor that has been completely redesigned to accommodate this architecture. In this manner the initial shifting discussed above would not necessarily be required, and the clocking would resemble that of the prior art devices in which there are no separate optical and electrical pixels.

The preferred embodiment of the present invention is an Eastman Kodak device, commercially referred to as the KAF-2000®. This device is a 1728×1168 pixel, Full Frame CCD image sensor having large (13 $\mu m^2$) square pixels. It can be fabricated using the no-field fabrication process and has 1.2 $\mu m$ minimum drawn dimensions, to maximize the pixel charge capacity and photosensitive area (~75% fill factor). This device incorporates transparent ITO second gate electrodes and ONO gate dielectric for better light transmittance. Lastly, it incorporates the "shifted" color filters design for higher quantum efficiency. Calculations show that the device is about 1.75 times more light sensitive. The amount of dark current should be about 33% lower and the dark current noise level should be about 1.2 times lower. This is a consequence of the smaller pixel area and the no-field process, which does not have a bird's beak and its associated high dark current generation and a lower resistivity substrate that reduces the size of the depletion region. The calculated charge capacity of this sensor is close to 3000 ke—for devices made using the no-field process. Its high charge capacity, high light sensitivity, and low dark current and noise should allow the KAF-2000 sensor to operate at high photographic speeds, such as ISO level 3200 or higher.

In addition, the pixel design for the image sensors envisioned by the preferred embodiment of present invention comprises a microlens architecture such that there is at least one gate electrode comprising indium tin oxide (ITO) formed over the photosensitive region; and at least one lenslet associated with the ITO electrode juxtaposition to focus light incident upon the pixel such that it is focused towards the ITO electrode. In this manner, a greater amount of light can be focused on the more sensitive ITO electrode.

The invention has been described with reference to a preferred embodiment. However, it will be appreciated that variations and modifications can be effected by a person of ordinary skill in the art without departing from the scope of the invention.

Parts List:
10 pixel
11 first storage area
12 second storage area
15 channel stop
16 lateral overflow drain
17 p-type container implant
19 barrier region
21 barrier region
22 barrier region
24 substrate
26 epitaxial layer
28 ONO dielectric
30 ITO electrodes
32 polysilicon electrodes
33 rectangular cut
34 nitride layer
35 top oxide layer
36 bottom oxide layer
41 top oxide layer
42 nitride layer
43 bottom oxide layer
45 rectangular cut
51 nitride layer
52 silicon dioxide
61 magenta filter
62 yellow filter
63 cyan filter
65 overlapping regions
66 red pixels
67 green pixels
71 magenta filter
72 yellow filter
73 cyan filter
75 overlapping regions
76 red pixels
77 green pixels
85 prior art pixel
86 electrical pixel
87 optical pixel
99 lenslet

We claim:

1. A method of forming image sensors comprising:

providing a substrate of a first conductivity type having a plurality of pixel elements formed within the substrate, such that there is at least one gate electrode within each of the pixel elements comprising indium tin oxide and at least one gate electrode within each of the pixel elements comprising polysilicon; and forming a plurality of overlapping color filters arranged such that overlapping of the color filters occurs above the polysilicon electrode.

2. The method of claim 1 further comprising the step of:

creating at least one lenslet associated with the ITO electrode juxtapositioned to focus light incident upon the pixel such that it is focused towards the ITO electrode.

3. The method of claim 1 further comprising the step of creating a clock mechanism for shifting charge out of the pixel area and output means for receiving charge shifted out.

4. The method of claim 3 wherein the step of creating a clock mechanism for shifting further comprises having an extra pulse capable of shifting accumulated charge one phase.

5. The method of claim 1 wherein the step of forming further comprises creating the color filters within each pixel such that each pixel is a single color.

6. The method of claim 1 wherein the forming step further comprises creating the color filters within each pixel such that each pixel represents various colors.

7. The method of claim 1 wherein the providing step further comprises creating the pixels such that the sensor is a two phase device.

* * * * *